United States Patent
Park et al.

(10) Patent No.: US 9,985,618 B2
(45) Date of Patent: May 29, 2018

(54) DIGITAL DUTY CYCLE CORRECTION FOR FREQUENCY MULTIPLIER

(71) Applicant: QUALCOMM Incorporated, San Diego, CA (US)

(72) Inventors: Dongmin Park, San Diego, CA (US); Jong Min Park, San Diego, CA (US); Lai Kan Leung, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/153,496

(22) Filed: May 12, 2016

(65) Prior Publication Data

US 2017/0187364 A1  Jun. 29, 2017

Related U.S. Application Data

(60) Provisional application No. 62/387,334, filed on Dec. 23, 2015.

(51) Int. Cl.
| | |
|---|---|
| *H03D 3/24* | (2006.01) |
| *H03K 5/156* | (2006.01) |
| *H03L 7/081* | (2006.01) |
| *H03L 7/089* | (2006.01) |
| *H03L 7/091* | (2006.01) |
| *H03L 7/093* | (2006.01) |
| *H03L 7/16* | (2006.01) |
| *H04L 7/00* | (2006.01) |
| *H04L 7/033* | (2006.01) |

(52) U.S. Cl.
CPC ......... *H03K 5/1565* (2013.01); *H03L 7/0814* (2013.01); *H03L 7/0891* (2013.01); *H03L 7/091* (2013.01); *H03L 7/093* (2013.01); *H03L 7/16* (2013.01); *H04L 7/0087* (2013.01); *H04L 7/0331* (2013.01); *H04L 7/0332* (2013.01)

(58) Field of Classification Search
CPC ... H03L 7/0814; H03L 7/0891; H04L 7/0087; H04L 7/0332
USPC .......................................... 375/355, 326, 300
See application file for complete search history.

(56) References Cited

U.S. PATENT DOCUMENTS

| | | |
|---|---|---|
| 5,060,180 A | 10/1991 | Kingston et al. |
| 7,352,297 B1 | 4/2008 | Rylyakov et al. |
| 7,705,647 B2 | 4/2010 | Dai et al. |
| 7,821,315 B2 | 10/2010 | Bossu et al. |
| 8,076,963 B2 | 12/2011 | Huang et al. |
| 8,169,243 B2 | 5/2012 | Quan et al. |
| 8,212,610 B2 | 7/2012 | Bereza et al. |
| 8,380,138 B2 | 2/2013 | Wadhwa et al. |
| 8,618,854 B2 | 12/2013 | Narathong et al. |

(Continued)

OTHER PUBLICATIONS

Huh H. et al., "Comparison Frequency Doubling and Charge Pump Matching Techniques for Dual-Band ΔΣ Fractional-N Frequency Synthesizer," IEEE Journal of Solid-State Circuits, vol. 40 (11), Nov. 1, 2005 (Nov. 1, 2005), pp. 2228-2236, XP011141631.

(Continued)

*Primary Examiner* — Wednel Cadeau
(74) *Attorney, Agent, or Firm* — Qualcomm Incorporated-Toler (57) ABSTRACT

An apparatus includes a phase detector coupled to an output of a frequency multiplier. A digital loop filter is coupled to the phase detector, and a duty cycle correction circuit is coupled to the digital loop filter.

20 Claims, 8 Drawing Sheets

(56) References Cited

U.S. PATENT DOCUMENTS

| | | |
|---|---|---|
| 8,718,574 B2 | 5/2014 | Panikkath et al. |
| 8,723,568 B1 | 5/2014 | Terrovitis |
| 8,736,329 B1 | 5/2014 | Rajavi et al. |
| 8,786,329 B1 | 7/2014 | Terrovitis |
| 8,803,575 B2 | 8/2014 | Terrovitis |
| 8,901,975 B2 | 12/2014 | Navid |
| 8,988,121 B2 | 3/2015 | Terrovitis |
| 2001/0056332 A1 | 12/2001 | Abrosimov et al. |
| 2003/0201806 A1* | 10/2003 | Cho .................. G06F 7/68 327/116 |
| 2008/0298476 A1* | 12/2008 | Bereza ............ H03K 5/15026 375/257 |
| 2012/0119801 A1* | 5/2012 | Hsieh .................. H03L 7/087 327/156 |
| 2012/0182053 A1 | 7/2012 | Yang |
| 2014/0340132 A1* | 11/2014 | Terrovitis .............. H03L 7/08 327/157 |
| 2015/0215110 A1 | 7/2015 | Chen |
| 2016/0380752 A1* | 12/2016 | Ahmad ............. H04L 7/0016 327/158 |

OTHER PUBLICATIONS

Cheng K-H., et al., "A 2GHz Fully Differential DLL-Based Frequency Multiplier for High Speed Serial Link Circuit", Conference Proceedings / IEEE International Symposium on Circuits and Systems (ISCAS), May 23-26, 2005, International Conference Center, Kobe, Japan, IEEE Service Center, Piscataway, NJ, May 23, 2005, XP010815768, pp. 1174-1177.

International Search Report and Written Opinion—PCT/US2016/063151—ISA/EPO—dated Feb. 15, 2017.

Weng R-M., et al., "A Low Jitter Arbitrary-Input Pulsewidth Control Loop with Wide Duty Cycle Adjustment", Circuits and Systems, 2009, ISCAS 2009, IEEE International Symposium on IEEE, Piscataway, NJ, USA, May 24, 2009, XP031479444, pp. 1301-1304.

* cited by examiner

FIG. 8

DIGITAL DUTY CYCLE CORRECTION FOR FREQUENCY MULTIPLIER

I. CROSS REFERENCE TO RELATED APPLICATIONS

The present application claims the benefit of U.S. Provisional Patent Application No. 62/387,334, entitled "DIGITAL DUTY CYCLE CORRECTION FOR FREQUENCY MULTIPLIER," filed Dec. 23, 2015, which is expressly incorporated by reference herein in its entirety.

II. FIELD

The present disclosure is generally related to electronics, and more specifically to generating electrical signals.

III. BACKGROUND

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities and may support increasing wireless communication capability, particularly in downlink communications that provide information to the wireless telephones.

Electronic devices typically generate signals, such as clock signals, that may be used during radio-frequency (RF) processing and other operations. For example, an electronic device may use a frequency multiplier to generate an output signal at a frequency that is a multiple of a frequency of an input signal. However, such electronic devices may suffer performance degradation when a duty cycle of a generated signal is unbalanced (e.g., the duty cycle is not 50%). For example, a doubler circuit that generates an output signal having twice the frequency of an input signal may introduce (or increase) jitter on the output signal when the duty cycle of the input signal is not 50%. Jitter may cause phase noise degradation in a radio-frequency (RF) device such as a wireless telephone.

V. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
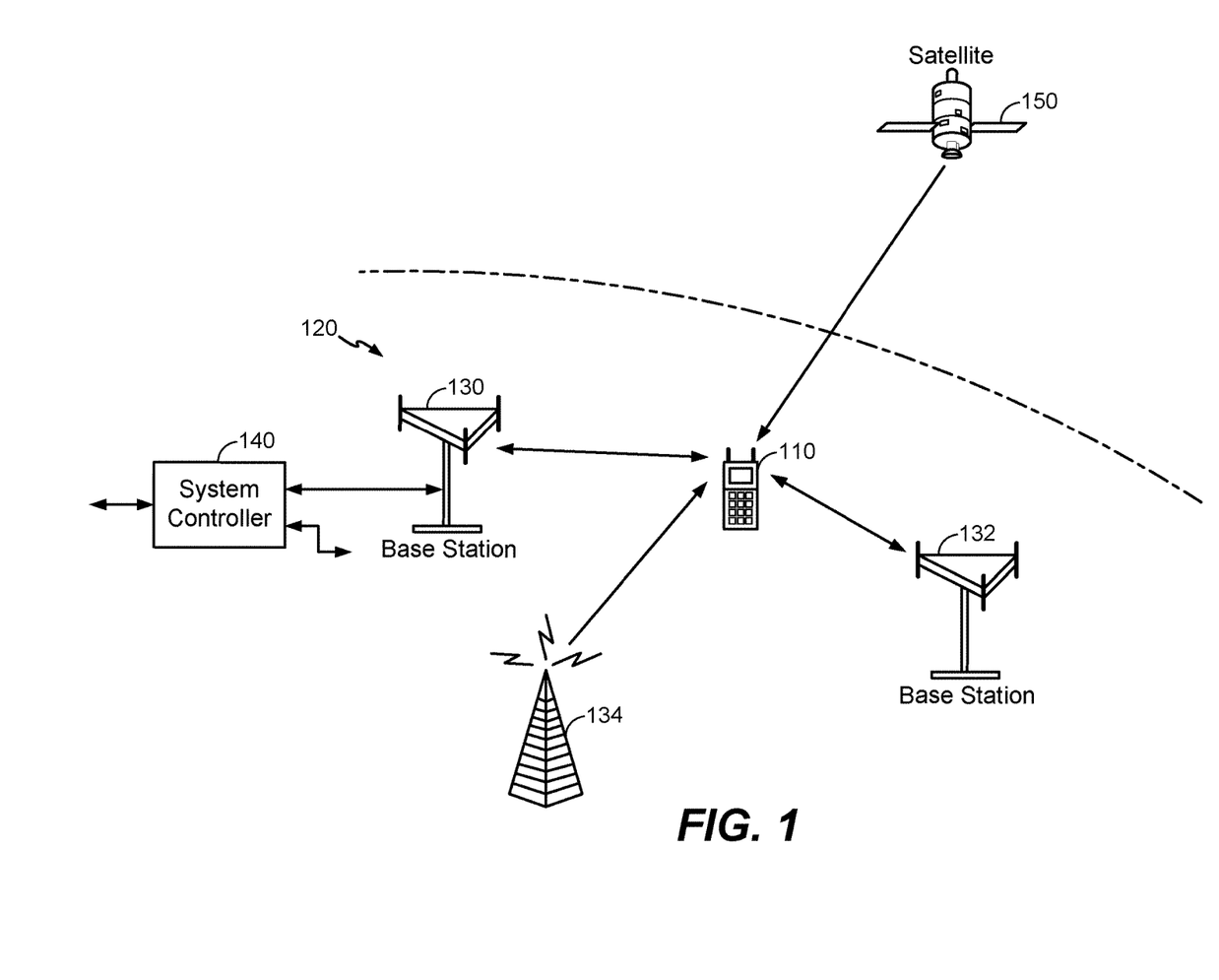
FIG. 1 shows a wireless device that includes a digital duty cycle correction circuit for a frequency multiplier, the wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth® device (Bluetooth® is a registered trademark of Bluetooth SIG, Inc.), etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication, such as LTE, WCDMA, CDMA 1x, EVDO, TD-SCDMA, GSM, 802.11, etc. Further, in an exemplary embodiment, the wireless device 110 includes a digital duty cycle correction circuit for a frequency multiplier, which is described in further detail with respect to FIGS. 2-7.

Figure 2:
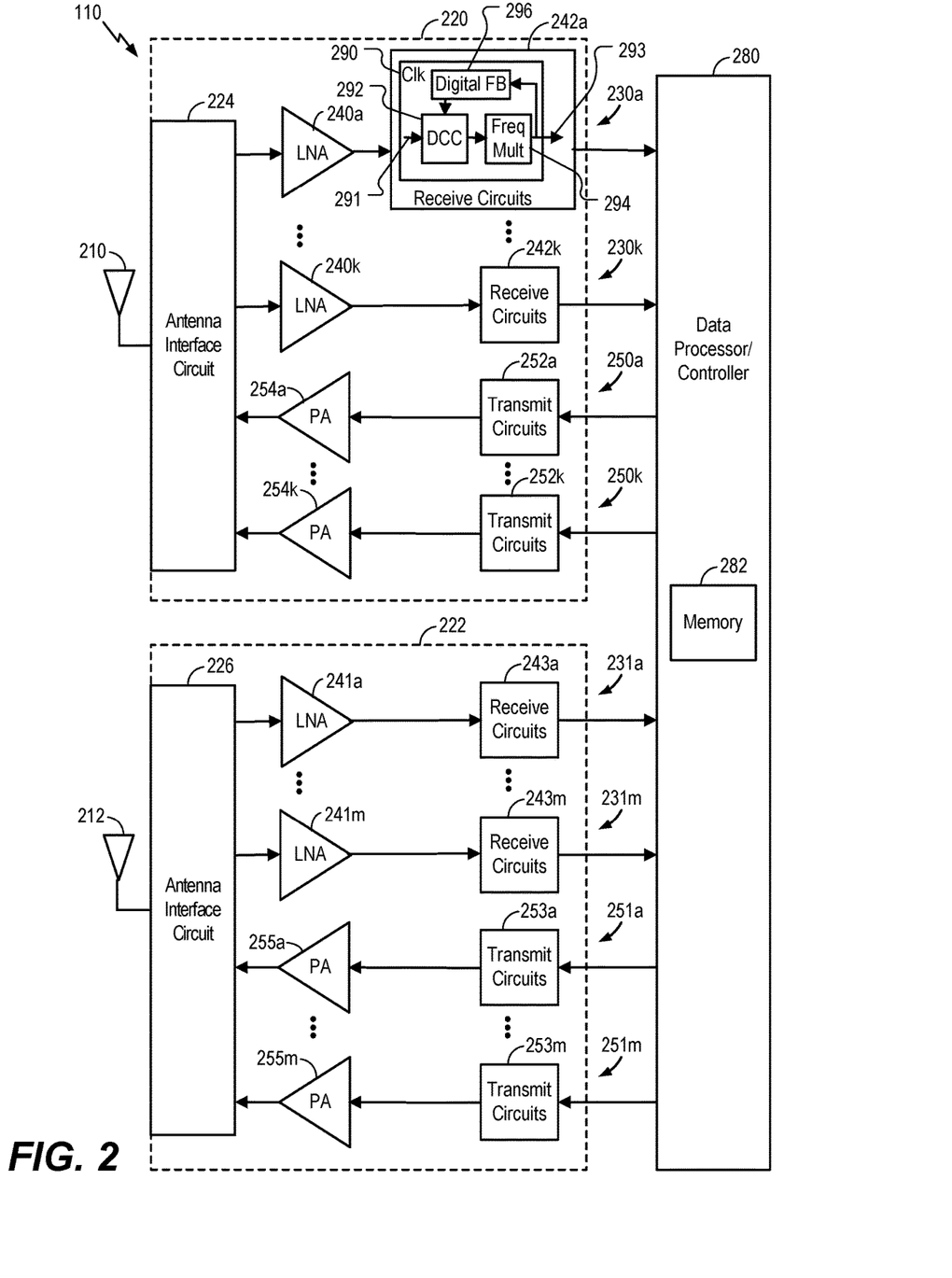
FIG. 2 is a block diagram that illustrates components of the wireless device in FIG. 1.

FIG. 2 shows a block diagram of an exemplary design of the wireless device 110 in FIG. 1. In this exemplary design, wireless device 110 includes a transceiver 220 coupled to a primary antenna 210 via an antenna interface circuit 224, a transceiver 222 coupled to a secondary antenna 212 via an antenna interface circuit 226, and a data processor/controller 280. Transceiver 220 includes multiple (K) receivers 230a to 230k and multiple (K) transmitters 250a to 250k to support multiple frequency bands, multiple radio technologies, carrier aggregation, etc. Transceiver 222 includes multiple (M) receivers 231a to 231m and multiple (M) transmitters 251a to 251m to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230a to 230k and 231a to 231m includes one of the LNAs 240a to 240k or 241a to 241m that is configured to provide an RF signal to one of the receive circuits 242a to 242k or 243a to 243m. For data reception, the primary antenna 210 receives signals from base stations and/or other transmitter stations and provides a received RF signal, which is routed through the antenna interface circuit 224. Antenna interface circuit 224 may include switches, duplexers, transmit filters, receive filters, matching circuits, etc. An output of the antenna interface circuit 224 is presented as an input RF signal to one or more of the receivers 230a to 230k, such as via a first input signal path to receiver 230a or via a second input signal path to receiver 230k. Within the one or more of the receivers 230a to 230k, the input RF signal is amplified and provided to the respective one or more receive circuits 242a to 242k.

The description below assumes that receiver 230a is selected to receive an RF signal. The RF signal is received from the antenna 210 via the antenna interface circuit 224 and is provided to the LNA 240a. An amplified RF signal is generated by the LNA 240a. Receive circuits 242a downconvert the amplified RF signal, amplify and filter the downconverted signal, and provide an analog input signal to data processor/controller 280. Receive circuits 242a may include mixers, filters, amplifiers, matching circuits, an oscillator, a local oscillator (LO) generator, a phase locked loop (PLL), etc.

As illustrated, the receive circuits 242a include a clock generator circuit 290 with a frequency multiplier 294 that is configured to generate an output signal 293 (e.g., a LO or other clock signal) having a frequency that is a multiple of the frequency of an input signal 291. Because the frequency multiplier 294 may introduce phase variations resulting in systematic jitter or subharmonic spur in the output signal 293 when an input to the frequency multiplier 294 has an unbalanced duty cycle (e.g., a duty cycle other than 50%), a duty cycle correction circuit 292 is configured to process the input signal 291 to generate a duty cycle corrected signal that is output to the frequency multiplier 294. The duty cycle correction circuit 292 is responsive to a control signal from a digital feedback circuit 296. As described in further detail with respect to FIG. 3, the digital feedback circuit 296 is coupled to the output of the frequency multiplier 294 and may include a phase detector responsive to the output signal 293 to detect phase variations in the output signal 293. A digital loop filter may generate the control signal to the duty cycle correction circuit 292 to adjust operation of the duty cycle correction circuit 292 to reduce phase variations in the output signal 293. Although the clock generator circuit 290 is described with respect to the receive circuits 242a, each of the receive circuits 242a to 242k and 243a to 243m may include a clock generator circuit that operates substantially as described with respect to the clock generator circuit 290.

In the exemplary design shown in FIG. 2, each of the transmitters 250a to 250k and 251a to 251m includes one of the transmit circuits 252a to 252k and 253a to 253m and one of the power amplifiers (PAs) 254a to 254k and 255a to 255m. For data transmission, data processor/controller 280 processes (e.g., encodes and modulates) data to be transmitted and provides an analog output signal to a selected transmitter. The description below assumes that transmitter 250a is the selected transmitter to transmit a RF signal. Within transmitter 250a, transmit circuits 252a amplify, filter, and upconvert the analog output signal from baseband to RF and provide a modulated RF signal. Transmit circuits 252a may include amplifiers, filters, mixers, matching circuits, an oscillator, an LO generator, a PLL, etc. Although not illustrated, one or more of the transmit circuits 252a to 252k and 253a to 253m may include a clock generator circuit that operates substantially as described with respect to the clock generator circuit 290.

A PA 254a receives and amplifies the modulated RF signal and provides a transmit RF signal having the proper output power level. The transmit RF signal is routed through antenna interface circuit 224 and transmitted via antenna 210. Each of the transmitters 250a to 250k and 251a to 251m in transceivers 220 and 222 may operate in a similar manner as transmitter 250a.

FIG. 2 shows an exemplary design of receivers 230a to 230k and 231a to 231m and transmitters 250a to 250k and 251a to 251m. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240a to 240k and 241a to 241m and receive circuits 242a to 242k and 243a to 243m may be implemented on one module, which may be an RFIC, etc.

Data processor/controller 280 may perform various functions for wireless device 110. For example, data processor/controller 280 may perform processing for data received via receivers 230a to 230k and 231a to 231m and data to be transmitted via transmitters 250a to 250k and 251a to 251m. Data processor/controller 280 may control the operation of the various circuits within transceivers 220 and 222. A memory 282 may store program code and data for data processor/controller 280. Data processor/controller 280 may be implemented on one or more application specific integrated circuits (ASICs) and/or other ICs.

Wireless device 110 may support multiple band groups, multiple radio technologies, and/or multiple antennas. Wireless device 110 may include a number of LNAs to support reception via the multiple band groups, multiple radio technologies, and/or multiple antennas. Exemplary embodiments of components that may be used in the wireless device 110 are described in further detail with respect to FIG. 3.

Figure 3:
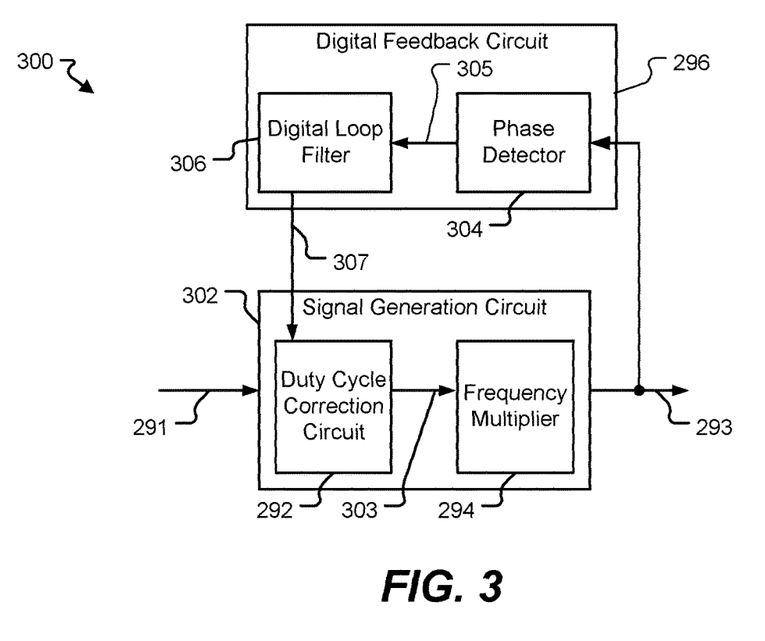
FIG. 3 is a block diagram of an exemplary embodiment of components including a digital duty cycle correction circuit for a frequency multiplier that may be included in the wireless device of FIG. 1.

FIG. 3 depicts an exemplary embodiment of components of a device 300 that may be included in the wireless device 110 of FIGS. 1-2. For example, the device 300 may correspond to the clock generation circuit 290 of FIG. 2. The device 300 includes a signal generation circuit 302 configured to receive the input signal 291 and generate the output signal 293. The signal generation circuit 302 includes the duty cycle correction circuit 292 and the frequency multiplier 294. The duty cycle correction circuit 292 is responsive to a control signal 307 from the digital feedback circuit 296. The digital feedback circuit 296 includes a phase detector 304 and a digital loop filter 306.

The duty cycle correction circuit 292 is configured to receive the input signal 291 and to generate a duty cycle adjusted signal 303. For example, the duty cycle correction circuit 292 may generate a first transition (e.g., a rising edge) in the duty cycle adjusted signal 303 responsive to a first transition in the input signal 291, and may generate a second transition (e.g., a falling edge) in the duty cycle adjusted signal 303 responsive to a control setting to approximate a 50% duty cycle in the adjusted signal. The duty cycle correction circuit 292 may be configured to adjust one or more control settings based on a value of the control signal 307 from the digital feedback circuit 296. For example, as described further with respect to FIGS. 4-7, the control signal 307 may have a first value or range of values indicating that a duty cycle of the adjusted signal is too low (e.g., <50%) or may have a second value or range of values indicating that a duty cycle of the adjusted signal is too high (e.g., >50%).

For example, if the control signal 307 indicates that the duty cycle of the adjusted signal 303 is too low, the duty cycle correction circuit 292 may increase the duty cycle of the duty cycle adjusted signal 303 by either increasing a delay before generating a falling edge of the duty cycle adjusted signal 303 or reducing a delay before generating a rising edge of the duty cycle adjusted signal 303, or both. If the control signal 307 indicates the duty cycle of the adjusted signal 303 is too high, the duty cycle correction circuit 292 may decrease the duty cycle of the duty cycle adjusted signal 303 by either reducing a delay at the falling edge of the duty cycle adjusted signal 303 or increasing delay at the rising edge of the duty cycle adjusted signal 303, or both.

The frequency multiplier 294 may be coupled to an output of the duty cycle correction circuit 292. The frequency multiplier 294 may be configured to generate the output signal 293 based on the duty cycle adjusted signal 303 received from the duty cycle correction circuit 292. For example, the frequency multiplier 294 may include a frequency doubler, and each rising edge and each falling edge of the duty-cycle adjusted signal that is output by the duty cycle correction circuit 292 may trigger the frequency doubler to generate a pulse in the output signal 293 so that the frequency of the output signal 293 is twice the frequency of the input signal 291.

The phase detector 304 is configured to generate a phase detector output signal 305 based on a detected phase of the output signal 293. For example, the phase detector 304 may include a bang bang phase detector that generates a digital phase detector output signal 305 based on a phase comparison of the output signal 293 to a reference signal, such as illustrated in the exemplary embodiments shown in FIGS. 4-7.

The digital loop filter 306 is coupled to the phase detector 304 and to the duty cycle correction circuit 292. The digital loop filter 306 is configured to filter the digital phase detector output signal 305 to generate the control signal 307. For example, the digital loop filter 306 may include an accumulator, such as a counter or an adder that is configured to accumulate values of the digital phase detector output signal 305, such as illustrated in the exemplary embodiments shown in FIG. 4 and FIG. 6. The control signal 307 indicates whether the duty cycle correction circuit 292 should increase or decrease a duty cycle of the duty cycle adjusted signal 303.

During operation, phase variations are introduced in the output signal 293 when the duty cycle of the signal output by the duty cycle correction circuit 292 varies from 50%. Examples of such phase variations in the output signal 293 are described with respect to FIG. 5 and FIG. 7. The phase variations are detected by the phase detector 304 and are indicated by the digital phase detector output signal 305. The digital loop filter 306 filters the digital phase detector output signal 305 and generates the control signal 307. The duty cycle correction circuit 292 adjusts the duty cycle of the duty cycle adjusted signal 303 based on the control signal 307, reducing the phase variation in the output signal 293 after adjusting the duty cycle to a value that more closely approximates (or equals) 50%.

Figure 4:
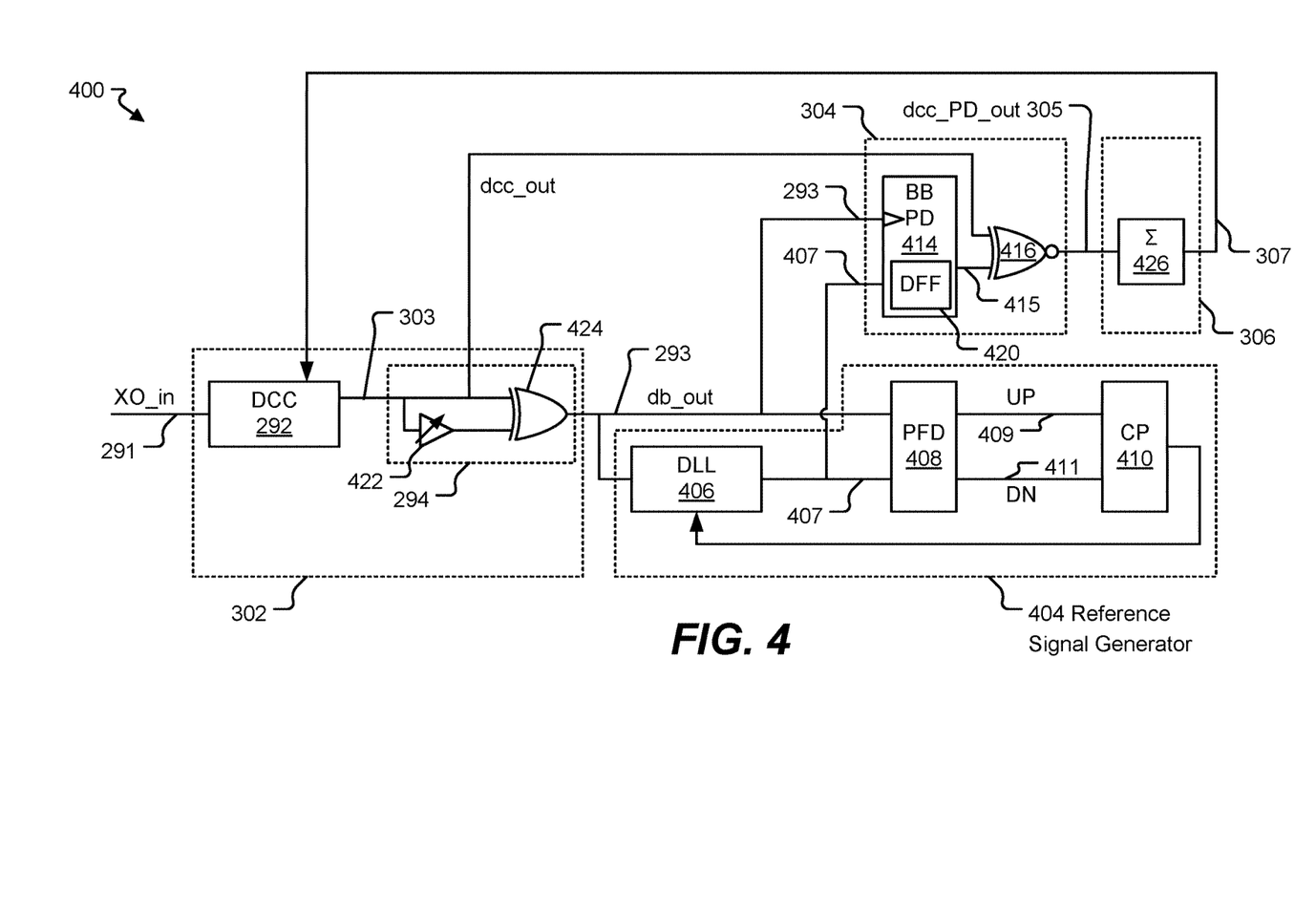
FIG. 4 is a block diagram of another exemplary embodiment of components including a digital duty cycle correction circuit and a frequency multiplier that may be included in the wireless device of FIG. 1.

The digital loop filter 306 may provide improved accuracy as compared to analog components. For example, as illustrated in FIG. 4, the digital loop filter 306 may include an accumulator to integrate the digital phase detector output signal 305, avoiding static phase offset effects that may occur in other implementations that use analog devices. For example, an alternative device that uses an analog feedback circuit instead of the digital feedback circuit 296 may perform analog signal integration using a charge pump that is responsive to an analog phase detector. A mismatch in the charge pump may cause the duty cycle adjusted signal 303 to have a static duty cycle offset, resulting in a static phase offset in the output signal 293. Reduction of static phase offset by use of the digital loop filter 306 results in reduced jitter (or spurs) during radio frequency signal processing (e.g., mixing) that uses the output signal 293.

FIG. 4 depicts an exemplary embodiment of a device 400 that includes the signal generation circuit 302, the phase detector 304, and the digital loop filter 306 of FIG. 3 and that also includes a reference signal generator 404.

The duty cycle correction circuit (DCC) 292 is configured to receive the input signal 291 (e.g., a clock signal "XO_in") and generate a duty cycle adjusted signal (dcc_out) 303. The frequency multiplier 294 (illustrated as a frequency doubler) includes a delay element 422 (e.g., a variable delay buffer or buffer chain) and an XOR gate 424. The XOR gate 424 may be configured to receive the duty cycle adjusted signal 303 at a first input and to receive a delayed version of the duty cycle adjusted signal 303 at a second input.

The reference signal generator 404 includes a delay locked loop (DLL) 406 coupled to receive the output signal (db_out) 293 and configured to generate a reference signal 407. A phase frequency detector (PFD) 408 is configured to detect a phase difference between the output signal 293 and the reference signal 407 and to generate "UP" signals 409 and/or "DN" signals 411 based on the detected phase difference. A charge pump (CP) 410 is responsive to the UP signals 409 and the DN signals 411 to generate an analog feedback signal to the DLL 406.

The phase detector 304 includes a bang bang phase detector (BBPD) 414 and a NOT-XOR (XNOR) gate 416. The BBPD 414 may be implemented using a flip flop circuit, such as a D flip flop circuit ("D flip flop") 420 that receives the output signal 293 at a clock input and receives the reference signal 407 at a data input. The XNOR gate 416 receives the duty cycle adjusted signal 303 and an output signal 415 of the bang bang phase detector 414 and generates the phase detector output signal (dcc_PD_out) 305. The phase detector output signal 305 may include a sequence of binary values, such as '1' values and '0' values, indicating results of phase measurements (e.g., comparisons of transitions and/or values of the output signal 293 and the reference signal 407). Various examples of phase measurements of the output signal 293 relative to the reference signal 407 and the resulting phase detector output signal 305 are provided with respect to FIG. 5 and FIG. 7.

The digital loop filter 306 includes an accumulator 426. The accumulator 426 may be a digital accumulator (e.g., a counter, buffer, or other digital logic) configured to accumulate values of the phase detector output signal 305, such as by incrementing an accumulated value when the phase detector output signal 305 has a "1" value. The accumulated value may be periodically indicated to the DCC 292 via the control signal 307. For example, the control signal 307 may include a multi-bit digital value that represents the accumulated value.

Figure 5:
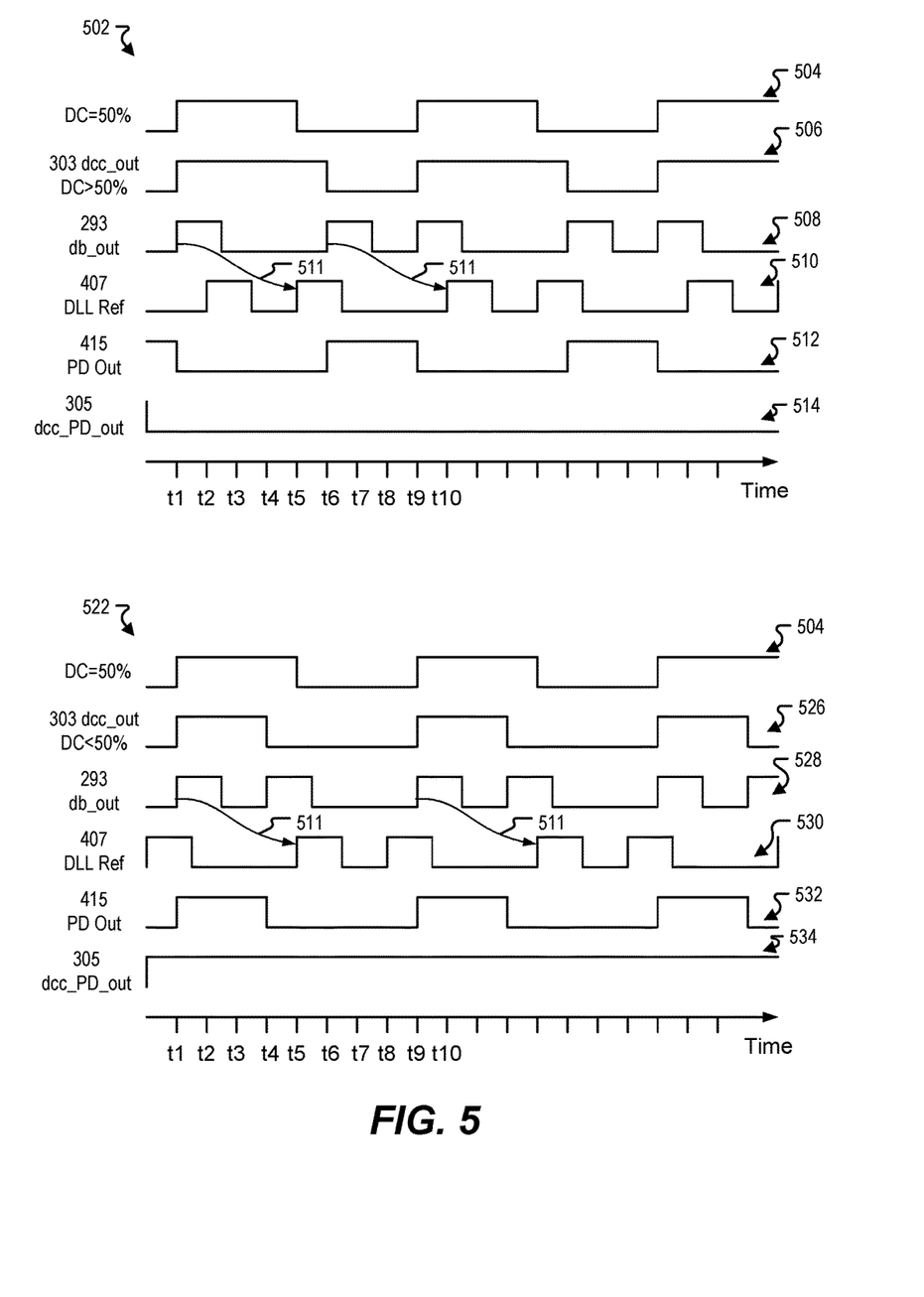
FIG. 5 illustrates exemplary embodiments of signals that may be generated during operation of the components of FIG. 4.

Operation of the device 400 is described with respect to FIG. 5. A first set of traces 502 illustrates examples of signals of the device 400 when the duty cycle adjusted signal (dcc_out) 303 has a duty cycle greater than 50%. Signal traces in FIG. 5 (and FIG. 7) are illustrated in simplified, "idealized" form for clarity of explanation and should not be construed as limiting. For example, rising and falling edges are illustrated as instantaneous transitions, signals are illustrated as maintaining constant values, and gate delays or propagation times of electronic components are ignored. Thus, the signal traces are not necessarily to scale and are not to be used to restrict the scope of the present disclosure.

Trace 504 illustrates a hypothetical signal with a 50% duty cycle. Trace 506 illustrates the duty cycle adjusted signal 303 that is output by the duty cycle correction circuit 292 and that has a duty cycle that is greater than 50% (e.g., due to non-ideal control settings in the duty cycle correction circuit 292). Trace 504 has a rising edge at time t1, a falling edge at time t5, and a next rising edge at time t9. Trace 506 has rising edges matching the rising edges of trace 504 and has a falling edge at time t6 that is delayed relative to the falling edge of trace 504 at time t5. The duty cycle of trace 506 is (5 units high)/(5 units high+3 units low)=62.5%.

Trace 508 illustrates the output signal (db_out) 293 generated by the frequency multiplier 294 operating as a frequency doubler as depicted in FIG. 4. Each rising edge and each falling edge of the duty cycle adjusted signal 303 (trace 506) triggers the frequency multiplier 294 to generate a rising edge of the output signal 293 (trace 508). A phase variation in the output signal 293 (trace 508) is due to the duty cycle adjusted signal 303 (trace 506) being greater than 50%, causing a delay between rising edges of the first two illustrated pulses of the output signal 293 (trace 508) at times t1 and t6 (a 5 unit delay) to exceed a delay between rising edges of the second two illustrated pulses at times t6 and t9 (a 3 unit delay).

Trace 510 illustrates the reference signal 407 generated by the DLL 406. The DLL 406 may generate the reference signal 407 (trace 510) having a delay 511 relative to the output signal 293 (trace 508). For example, the PFD 408 may cause the charge pump 410 to adjust the delay 511 of the DLL 406 based on a phase mismatch at the PFD 408 to maintain a delay between the reference signal 407 (trace 510) and the output signal 293 (trace 508) to be equal to an average period of the output signal 293 (trace 508) (e.g., a length of the delay 511 is adjusted to substantially equal a 4 unit average period of the output signal 293).

Trace 512 illustrates the output signal 415 of the bang bang phase detector 414 as the output of the D flip flop 420 responsive to the reference signal 407 (trace 510) at the data input of the D flip flop 420 and the output signal 293 (trace 508) at the clock input of the D flip flop 420. The D flip flop 420 samples the value of the reference signal 407 (trace 510) at each rising edge of the output signal 293 (trace 508) and holds the sampled value as the output signal 415 (trace 512) until the next rising edge of the output signal 293 (trace 508).

Trace 514 illustrates the digital phase detector output signal 305 at the output of the XNOR gate 416. Trace 514 has a value corresponding to the XNOR of the duty cycle adjusted signal 303 (trace 506) and the output signal 415 of the phase detector 304 (trace 512). Because the output signal 415 of the bang bang phase detector 414 (trace 512) behaves as the logical complement of the duty cycle adjusted signal 303 (trace 506), the digital phase detector output signal 305 (trace 514) maintains a logical low value.

A second set of traces 522 illustrates examples of signals of the device 400 when the duty cycle adjusted signal (dcc_out) 303 has a duty cycle less than 50%. Trace 504 illustrates a hypothetical signal with a 50% duty cycle. Trace 506 illustrates the duty cycle adjusted signal 303 that has a duty cycle <50% (e.g., due to non-ideal control settings in the duty cycle correction circuit 292). Trace 524 has a rising edge at time t1, a falling edge at time t5, and a next rising edge at time t9. Trace 526 has rising edges matching the rising edges of trace 504 and has a falling edge at time t4 that is early relative to the falling edge of trace 504 at time t5. The duty cycle of trace 526 is (3 units high)/(3 units high+5 units low)=37.5%.

Trace 528 illustrates the output signal (db_out) 293 generated by the frequency multiplier 294 operating as a frequency doubler as depicted in FIG. 4. A phase variation in the output signal 293 (trace 528) is due to the duty cycle of the duty cycle adjusted signal 303 (trace 506) being less than 50%, causing a delay between rising edges of the first two illustrated pulses of the output signal 293 (trace 528) at times t1 and t4 (a 3 unit delay) to be less than a delay between rising edges of the second two illustrated pulses at times t4 and t9 (a 5 unit delay).

Trace 530 illustrates the reference signal 407 generated by the DLL 406 having the delay 511 relative to the output signal 293 (trace 528).

Trace 532 illustrates the output signal 415 of the bang bang phase detector 414 as the output of the D flip flop 420 responsive to the reference signal 407 (trace 520) at the "data" input of the D flip flop 420 and the output signal 293 (trace 528) at the "clock" input of the D flip flop 420. The D flip flop 420 samples the value of the reference signal 407 (trace 530) at each rising edge of the output signal 293 (trace 528) and holds the sampled value as the output signal 415 (trace 532) of the bang bang phase detector 414 until the next rising edge of the output signal 293 (trace 528).

Trace 534 illustrates the digital phase detector output signal 305 at the output of the XNOR gate 416. Trace 514 has a value corresponding to the XNOR of the duty cycle adjusted signal 303 (trace 526) and the output signal 415 of the phase detector 304 (trace 532). Because the output signal 415 of the bang bang phase detector 414 (trace 532) matches the duty cycle adjusted signal 303 (trace 526), the digital phase detector output signal 305 (trace 534) maintains a logical high value.

The digital phase detector output signal 305 may therefore have a logical low value (trace 514) when the duty cycle of the duty cycle adjusted signal 303 is greater than 50% and a logical high value (trace 534) when the duty cycle is less than 50%. When the duty cycle of the duty cycle adjusted signal 303 is greater than 50% (trace 506), the accumulator 426 may accumulate '0' values when sampling the digital phase detector output signal 305 (trace 514), indicating that the duty cycle is greater than 50%. When the duty cycle of the duty cycle adjusted signal 303 is less than 50% (trace 526), the accumulator 426 may accumulate '1' values when sampling the digital phase detector output signal 305 (trace 534), indicating that the duty cycle is less than 50%. Thus, in an exemplary embodiment where the accumulator 426 accumulates 16 samples of the digital phase detector output signal 305 to generate the control signal 307, an accumulated value of 8 may correspond to a 50% average duty cycle, while accumulated values less than 8 may correspond to an average duty cycle that is greater than 50% and accumulated values greater than 8 may correspond to an average duty cycle that is less than 50%. The duty cycle correction circuit 292 may adjust operation based on an indication of the accumulated value received via the control signal 307.

As explained previously, using the accumulator 426 in the digital loop filter 306 may provide improved accuracy as compared to using analog components. Further, detecting rising edge lead or lag of the output signal 293 as compared to the reference signal 407 may be performed more accurately and with reduced complexity as compared to measuring the duty cycle of the duty cycle adjusted signal 303.

Figure 6:
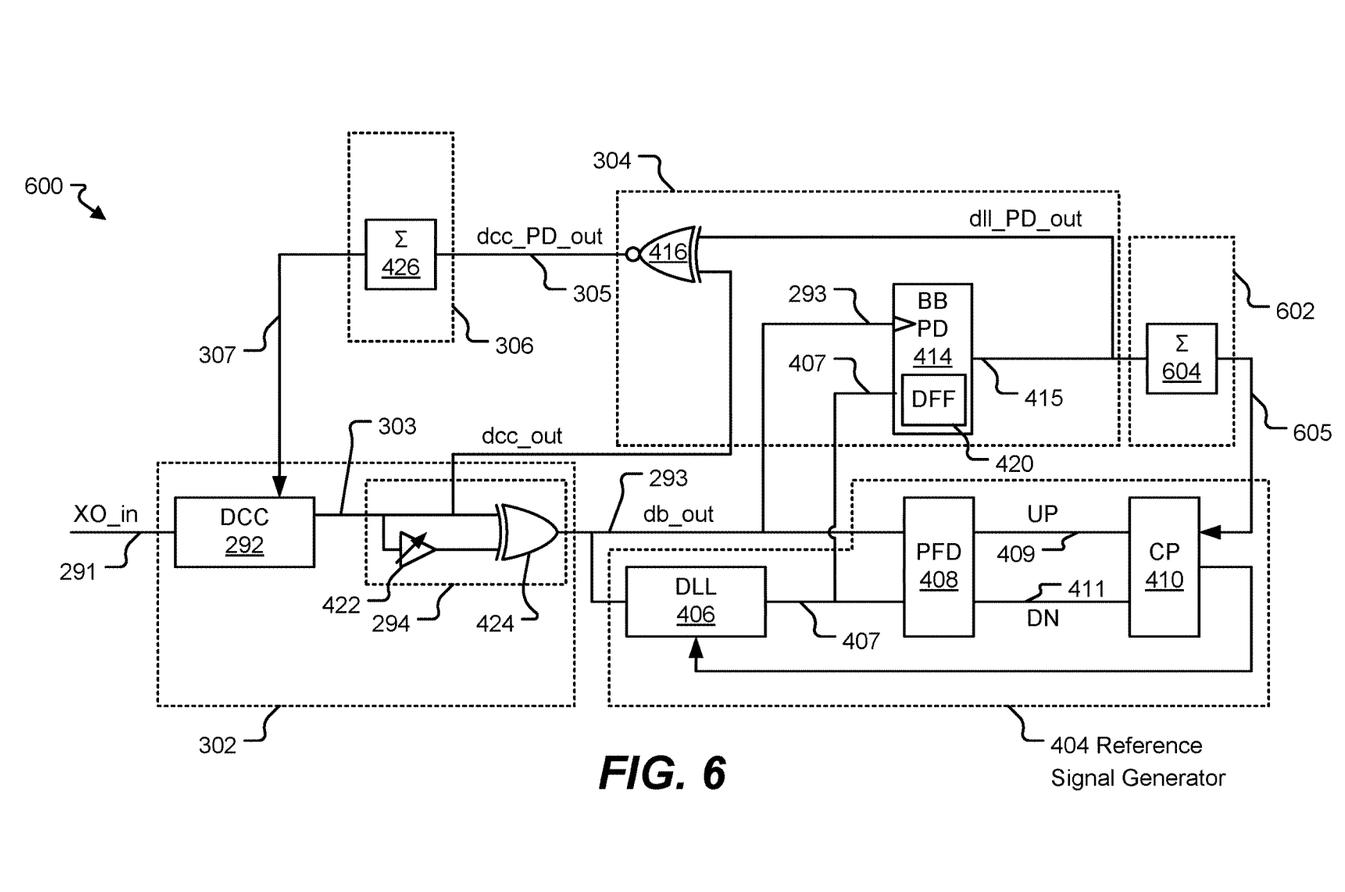
FIG. 6 is a block diagram of another exemplary embodiment of components including a digital duty cycle correction circuit and a frequency multiplier that may be included in the wireless device of FIG. 1.

FIG. 6 depicts another exemplary embodiment of a device 600 that includes the signal generation circuit 302, the phase detector 304, and the digital loop filter 306 of FIG. 3, and that also includes a second digital loop filter 602 that includes an accumulator 604. The accumulator 604 may receive the output signal 415 of the phase detector 304 and generate a charge pump mismatch signal 605. For example, the accumulator 604 may increment an accumulated value when the output signal 415 of the bang bang phase detector 414 has a "1" value and decrement an accumulated value when the phase detector output signal 415 has a "0" value. The accumulated value represents an amount of static delay in the reference signal 407 due to a mismatch at the charge pump 410. The accumulated value may be provided to the charge pump 410 as the charge pump mismatch signal 605 to adjust one or more analog components of the charge pump 410 to compensate for the mismatch of the charge pump 410.

Figure 7:
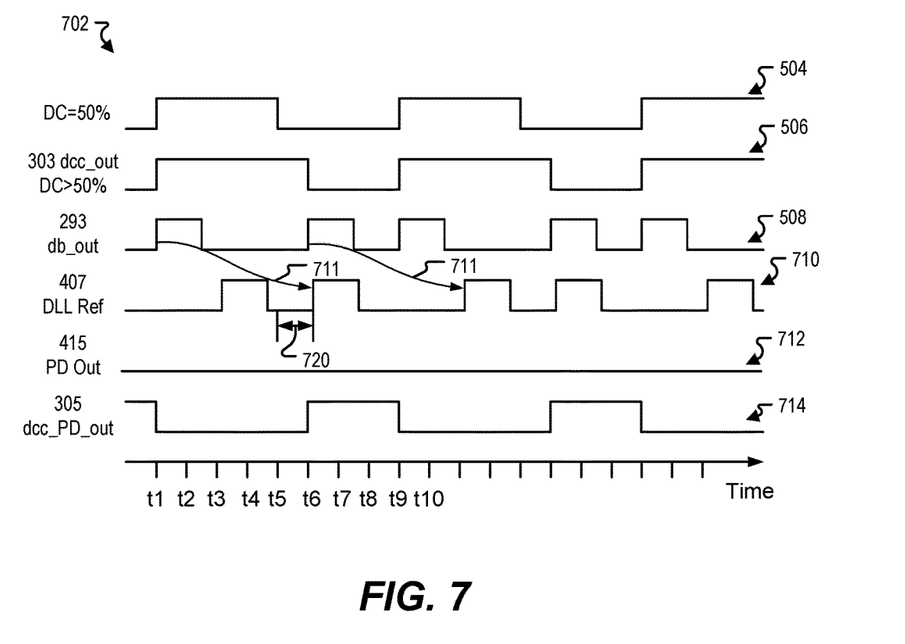
FIG. 7 illustrates exemplary embodiments of signals that may be generated during operation of the components of FIG. 6.

Operation of the device 600 is described with respect to FIG. 7. A set of traces 702 illustrates examples of signals of the device 600 when the duty cycle adjusted signal (dcc_out) 303 has a duty cycle other than 50% and the reference signal 407 from the DLL 406 has a static offset due to a charge/discharge mismatch in the charge pump 410. Traces 504, 506, and 508 illustrate a 50% duty cycle signal, the duty cycle adjusted signal 303 having a duty cycle of 62.5%, and the output signal 293, respectively, as previously described with reference to FIG. 5.

Trace 710 illustrates the reference signal 407 generated by the DLL 406 of FIG. 6. The DLL 406 may generate the reference signal 407 (trace 510) having a delay 711 relative to the output signal 293 (trace 508). An offset 720 portion of the delay 711 may be due to mismatch at the charge pump 410.

Trace 712 illustrates the output signal 415 of the bang bang phase detector 414 as the output of the D flip flop 420. Because the reference signal 407 (trace 710) has a logical low value at each rising edge of the output signal 293 (trace 508), the output signal 415 (trace 712) maintains a logical low value.

Trace 714 illustrates the digital phase detector output signal 305 at the output of the XNOR gate 416. Trace 714 has a value corresponding to the XNOR of the duty cycle adjusted signal 303 (trace 506) and the output signal 415 of the phase detector 304 (trace 712). The digital phase detector output signal 305 (trace 714) toggles as the logical complement of the duty cycle adjusted signal 303 (trace 706).

Although the trace 506 has the same duty cycle in FIG. 5 and FIG. 7, the phase detector output signal 305 of trace 514 of FIG. 5 provides an all '0' signal to the accumulator 426, while the phase detector output signal 305 of trace 714 of FIG. 7 provides a signal that is 60% '0' values and 40% '1' values. Thus, the offset 720 of the reference signal 407 (trace 710) partially 'masks' or reduces the magnitude of the duty cycle offset measurement, which may delay correction of the duty cycle to 50% at the duty cycle correction circuit 292.

However, by accumulating values of the output signal 415 of the bang bang phase detector 414, the second digital loop filter 602 (e.g., the accumulator 604) may enable adjustment of the charge pump 410 to reduce or eliminate the offset 720. For example, the output signal 415 of the bang bang phase detector 414 in trace 512 of FIG. 5 is 60% '1' values and 40% '0' values and tracks the duty cycle of the duty cycle adjusted signal 303 (trace 506). In contrast to FIG. 5, the positive offset 720 (e.g., longer than an average period of the output signal 293) as depicted in trace 710 of FIG. 7 causes the output signal 415 of the bang bang phase detector 414 in trace 712 to maintain a '0' value. In other conditions where the offset 720 has a relatively large negative offset (e.g., shorter than an average period of the output signal 293), the output signal 415 of the bang bang phase detector 414 may maintain a '1' value. Thus, accumulating samples of the output signal 415 of the bang bang phase detector 414 enables detection and at least partial reduction of the offset 720.

Compensating for the mismatch of the charge pump 410 may reduce or eliminate a static delay in the reference signal 407, which may improve accuracy of the control signal 307 and thereby improves the duty cycle accuracy of the duty cycle adjusted signal 303 output by the DCC 292. As a result, phase offset effects in the output signal 293 may be reduced.

Figure 8:
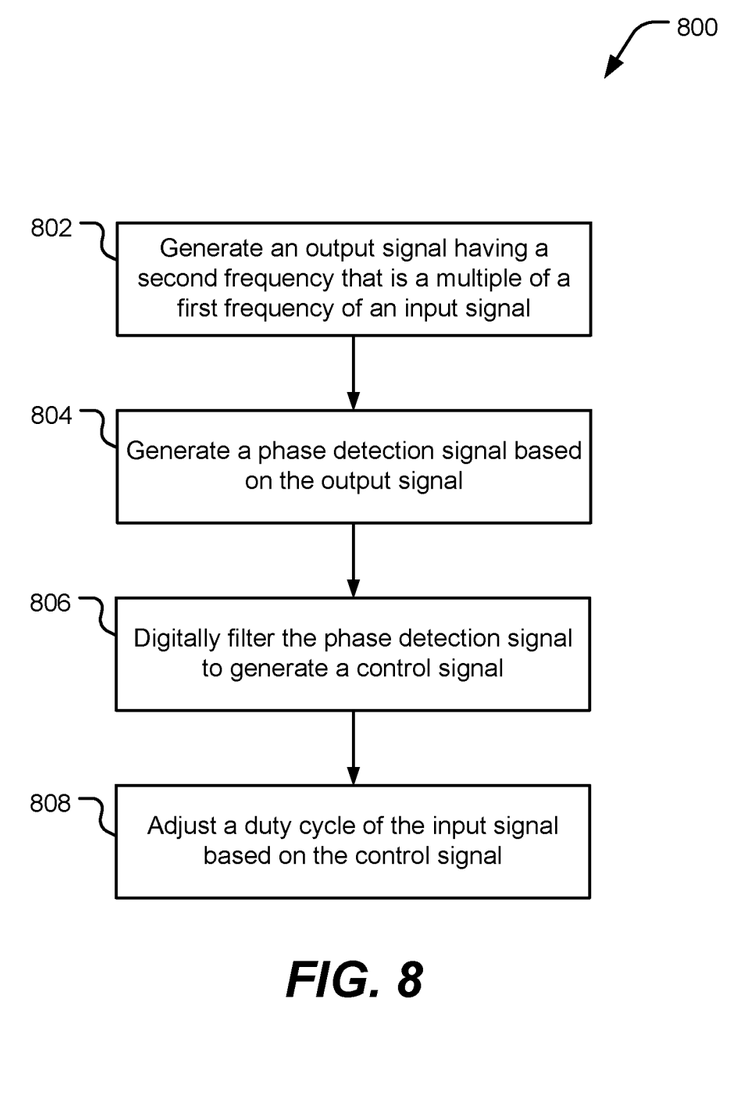
FIG. 8 illustrates a flowchart of a method that may be performed by the wireless device of FIG. 1.

Referring to FIG. 8, an exemplary embodiment of a method 800 is illustrated. The method 800 may be performed in an electronic device that includes a frequency multiplier, such as the wireless device 110 of FIGS. 1-2, the device 300 of FIG. 3, the device 400 of FIG. 4, or the device 600 of FIG. 6, as illustrative, non-limiting examples.

An output signal having a second frequency that is a multiple of a first frequency of an input signal is generated, at 802. For example, the output signal may correspond to the output signal 293 of FIG. 3 that is generated based on the input signal 291.

A phase detection signal is generated based on the output signal, at 804. For example, the phase detection signal may correspond to the phase detector output signal 305 of FIGS. 3-7.

The phase detection signal is digitally filtered to generate a control signal, at 806. For example, the phase detection signal may be digitally filtered by the digital loop filter 306 of FIGS. 3-4 or FIG. 6. To illustrate, the control signal may be generated by an accumulator that accumulates binary phase detection values from the phase detector 304 of FIGS. 3-4 or FIG. 6.

A duty cycle of the input signal is adjusted based on the control signal, at 808. To illustrate, the duty cycle correction circuit 292 of FIGS. 2-4 or FIG. 6 may adjust a duty cycle of the duty cycle adjusted signal 303 based on a value of the control signal 307.

In some implementations, the method 800 may also include generating a reference signal based on a delay of the output signal. Generating the phase detection signal may be based on comparing the output signal to the reference signal.

For example, the reference signal may correspond to the reference signal 407 of FIG. 4 or FIG. 6.

In some implementations, the method 800 may also include generating a charge pump mismatch signal based on the phase detection signal. For example, the charge pump mismatch signal may correspond to the charge pump mismatch signal 605 of FIG. 6 output by the accumulator 604.

Digitally filtering the phase detection signal to generate the control signal may provide improved accuracy as compared to using analog components. For example, using a digital filter to integrate the digital detection signal may avoid static phase offset effects that may arise from unbalanced analog devices. Reduction of static phase offset results in reduced jitter (or spurs) during radio frequency signal processing (e.g., mixing) that uses the output signal.

In accordance with the above-described implementations, an apparatus includes means for detecting a phase of an output signal of means for multiplying a frequency. For example, the means for detecting a phase may include the phase detector 304 of FIGS. 3-4 or FIG. 6, one or more other phase detectors or other circuits configured to detect a phase, or any combination thereof. The means for multiplying a frequency may include the frequency multiplier 294 of FIGS. 2-4 or FIG. 6, one or more other frequency multipliers or other circuits configured to generate an output signal having a frequency that is a multiple of the frequency of an input signal, or any combination thereof.

The apparatus may include means for digitally filtering a signal coupled to the means for detecting. For example, the means for digitally filtering a signal may include the digital loop filter 306 of FIGS. 3-4 or FIG. 6, one or more other filters, accumulators, or other circuits configured to digitally filter, or any combination thereof.

The apparatus may include means for correcting a duty cycle coupled to the means for digitally filtering a signal. For example, the means for correcting the duty cycle may include the duty cycle correction circuit 292 of FIGS. 2-4 or FIG. 6, one or more other duty cycle correction circuits or other circuits configured to adjust a duty cycle, or any combination thereof.

In an exemplary embodiment, the means for multiplying may include means for doubling a frequency. For example, the means for doubling the frequency may include the delay element 422 of FIG. 4 or FIG. 6, the XOR gate 424 of FIG. 4 or FIG. 6, one or more other circuits configured to double a frequency, or any combination thereof.

The means for detecting may include means for generating a binary phase detection signal. For example, the means for generating may include the bang bang phase detector 414 of FIG. 4 or FIG. 6, one or more other circuits configured to generate a binary phase detection signal, or any combination thereof.

The means for generating a binary phase detection signal may include means for latching data. For example, the means for generating may include the D flip flop 420 of FIG. 4 or FIG. 6, one or more other flip flops or latches, other circuits configured to latch data, or any combination thereof.

The means for digitally filtering a signal may include means for digitally accumulating phase detection. For example, the means for digitally filtering a signal may include the accumulator 426 of FIG. 4 or FIG. 6, one or more other adders or summers, other circuits configured to accumulate received values, or any combination thereof.

The apparatus may include means for generating a reference signal, the means for generating coupled to the means for detecting and including means for generating a delayed signal and means for providing a voltage. The means for generating a reference signal may be coupled to the output of the means for multiplying a frequency. For example, the means for generating a reference signal may include the reference signal generator 404 of FIG. 4 or FIG. 6, one or more other signal generators or other circuits configured to generate a reference signal, or any combination thereof. The means for generating a delayed signal may include the DLL 406 of FIG. 4 or FIG. 6, one or more other circuits configured to generate a delayed signal, or any combination thereof. The means for providing a voltage may include the charge pump 410 of FIG. 4 or FIG. 6, one or more other circuits configured to provide a voltage, or any combination thereof.

The apparatus may include means for filtering an output of the means for detecting and for providing a control signal to the means for providing a voltage. For example, the means for filtering an output of the means for detecting and for providing a control signal may include the second digital loop filter 602 of FIG. 6, one or more other filters, accumulators, or other circuits configured to filter an output and generate a control signal, or any combination thereof.

Those of skill in the art would understand that information and signals may be represented using any of a variety of different technologies and techniques. For example, data, instructions, commands, information, signals, bits, symbols, and circuits that may be referenced throughout the above description may be represented by voltages, currents, electromagnetic waves, magnetic fields or particles, optical fields or particles, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
 a phase detector coupled to an output of a frequency multiplier;
 a digital loop filter coupled to the phase detector;
 a duty cycle correction circuit coupled to the digital loop filter, the duty cycle correction circuit configured to receive an input signal as a first input and configured to receive a control signal from the digital loop filter as a second input;

a logic gate of the phase detector, the logic gate coupled to the digital loop filter and to the duty cycle correction circuit; and a reference signal generator coupled to the output of the frequency multiplier and coupled to an input of the phase detector, wherein the reference signal generator includes a delay locked loop and a charge pump.

2. The apparatus of claim 1, the frequency multiplier comprising a frequency doubler coupled to the duty cycle correction circuit and to the phase detector, the duty cycle correction circuit having an output coupled to an input of the frequency multiplier.

3. The apparatus of claim 1, the phase detector comprising a bang bang phase detector and the logic gate, the duty cycle correction circuit configured to adjust a duty cycle of the input signal based on the control signal.

4. The apparatus of claim 1, the digital loop filter comprising a digital accumulator.

5. The apparatus of claim 1, the reference signal generator further comprising a phase frequency detector, the phase frequency detector coupled to the delay locked loop and to the charge pump, wherein the reference signal generator is coupled to a D flip flop circuit of the phase detector.

6. The apparatus of claim 1, wherein the logic gate has a first input coupled to an output of the duty cycle correction circuit, a second input coupled to an output of a bang bang phase detector of the phase detector, and an output coupled to an input of the digital loop filter.

7. The apparatus of claim 3, the bang bang phase detector comprising a D flip flop circuit.

8. The apparatus of claim 5, further comprising an accumulator coupled to the charge pump.

9. The apparatus of claim 6, wherein the logic gate comprises an XNOR gate, wherein the XNOR gate is configured to receive a duty cycle adjusted signal from the duty cycle correction circuit and an output signal from the bang bang phase detector, and wherein the XNOR gate is configured to output a phase detector output signal to the digital loop filter.

10. The apparatus of claim 8, the accumulator coupled to an output of the phase detector.

11. The apparatus of claim 9, further comprising a second digital loop filter coupled to the phase detector, wherein an input of the second digital loop filter is coupled to the output of the phase detector and to the second input of the XNOR gate.

12. An apparatus comprising:
means for detecting a phase of an output signal of means for multiplying a frequency;
means for digitally filtering a signal, the means for digitally filtering coupled to the means for detecting;
means for correcting a duty cycle coupled to the means for digitally filtering and to the means for multiplying the frequency, the means for correcting the duty cycle configured to receive an input signal as a first input and configured to receive a control signal from the means for digitally filtering the signal as a second input;
means for generating a phase detector output signal coupled to the means for digitally filtering the signal and to the means for correcting the duty cycle; and
means for generating a reference signal, the means for generating the reference signal coupled to an input of the means for detecting and coupled to the output of the means for multiplying, the means for generating the reference signal including means for generating a delayed signal and means for providing a voltage.

13. The apparatus of claim 12, the means for multiplying the frequency coupled to the means for correcting the duty cycle and to the means for detecting.

14. The apparatus of claim 12, the means for detecting comprising means for generating a binary phase detection signal and the means for generating the phase detector output signal, the means for generating a binary phase detection signal comprising means for latching data.

15. The apparatus of claim 12, the means for digitally filtering comprising means for digitally accumulating phase detection, wherein the means for generating the phase detector output signal comprises an XNOR gate.

16. The apparatus of claim 12, the means for generating the reference signal further including means for detecting a phase difference between the output signal and the reference signal.

17. The apparatus of claim 16, further comprising means for filtering an output of the means for detecting and for providing a control signal to the means for providing a voltage.

18. A method comprising:
generating an output signal having a second frequency that is a multiple of a first frequency of an input signal;
generating a reference signal, the reference signal having a delay relative to the output signal;
generating a phase detection signal based on the output signal, the reference signal, and based on a duty cycle adjusted signal;
digitally filtering the phase detection signal to generate a control signal; and
adjusting a duty cycle of the input signal based on the control signal to update the duty cycle adjusted signal, the updated duty cycle adjusted signal provided to a frequency multiplier.

19. The method of claim 18, wherein generating the phase detection signal includes:
generating an intermediary signal based on a timing of the output signal and sampled values of the reference signal; and
comparing the intermediary signal to the duty cycle adjusted signal to generate the phase detection signal.

20. The method of claim 18, further comprising generating a charge pump mismatch signal based on the phase detection signal.

* * * * *